(12) United States Patent
Van Houdt et al.

(10) Patent No.: US 6,243,293 B1
(45) Date of Patent: *Jun. 5, 2001

(54) CONTACTED CELL ARRAY CONFIGURATION FOR ERASABLE AND PROGRAMMABLE SEMICONDUCTOR MEMORIES

(75) Inventors: Jan F. Van Houdt, Bekkevoort; Guido Groeseneken, Leuven; Herman Maes, Bierbeek, all of (BE)

(73) Assignee: Interuniversitair Micro-Elektronica Centrum, Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/267,443

(22) Filed: Mar. 12, 1999

Related U.S. Application Data

(63) Continuation-in-part of application No. 08/426,685, filed on Apr. 21, 1995, now Pat. No. 6,009,013, which is a continuation-in-part of application No. 08/275,016, filed on Jul. 13, 1994, now Pat. No. 5,583,811, and a continuation-in-part of application No. 08/080,225, filed on Jun. 21, 1993, now Pat. No. 5,583,810, said application No. 08/275,016, is a continuation of application No. 08/080,225, which is a continuation-in-part of application No. 07/827,715, filed on Jan. 29, 1992, now abandoned

(60) Provisional application No. 60/094,842, filed on Jul. 31, 1998.

(51) Int. Cl.$^7$ .................................................. G11C 11/34
(52) U.S. Cl. .............................. 365/185.14; 365/185.15; 365/185.16
(58) Field of Search .................... 365/185.15, 185.09, 365/185.14, 185.18

(56) References Cited

U.S. PATENT DOCUMENTS

| | | |
|---|---|---|
| 4,503,519 | 3/1985 | Arakawa . |
| 4,608,591 | 8/1986 | Ipri et al. . |
| 4,794,565 | 12/1988 | Wu et al. . |
| 4,821,236 | 4/1989 | Hayashi et al. . |

(List continued on next page.)

FOREIGN PATENT DOCUMENTS

| | | |
|---|---|---|
| 0 228 761 | 7/1987 | (EP) . |
| 501 941 | 9/1992 | (EP) . |
| 509 698 | 10/1992 | (EP) . |
| 57-169005 | 10/1982 | (JP) . |
| 58-115956 | 7/1983 | (JP) . |
| 59-58868 | 4/1984 | (JP) . |
| 60-9168 | 1/1985 | (JP) . |

OTHER PUBLICATIONS

IEDM, 1986, J. Esquivel et al., "High Density Contactless, Self Aligned EPROM Cell Array Technology," IEEE, 1986, pp. 592–595.

(List continued on next page.)

Primary Examiner—A. Zarabian
(74) Attorney, Agent, or Firm—McDonnell Boehnen Hulbert & Berghoff

(57) ABSTRACT

A contacted array of programmable and erasable semiconductor memory devices. Each of the memory devices has a split gate structure, including a source region, a drain region, a channel extending between the source and drain regions, a floating gate extending over a portion of the channel with a first dielectric layer therebetween, a control gate extending over a portion of the floating gate through a second dielectric layer, and a program gate extending above the floating gate with a dielectric layer therebetween. The program gate forms a capacitor with the floating gate with a coupling ratio sufficient to couple a voltage at least as high as the drain voltage to the floating gate, thereby establishing a high voltage at a point in the channel between the control gate and the floating gate and ensuring a high hot-electron injection towards the floating gate.

14 Claims, 11 Drawing Sheets

U.S. PATENT DOCUMENTS

| | | |
|---|---|---|
| 4,947,222 | 8/1990 | Gill et al. . |
| 4,996,668 | 2/1991 | Paterson et al. . |
| 4,998,220 | 3/1991 | Eitan et al. . |
| 5,034,926 | 7/1991 | Taura et al. . |
| 5,042,009 | 8/1991 | Kazerounian et al. . |
| 5,077,691 | 12/1991 | Haddad et al. . |
| 5,091,882 | 2/1992 | Naruke . |
| 5,212,541 | 5/1993 | Bergemont . |
| 5,280,446 | 1/1994 | Ma et al. . |
| 5,284,784 | 2/1994 | Manley . |
| 5,338,952 | 8/1994 | Yamauchi . |
| 5,394,360 | 2/1995 | Fukumoto . |
| 5,418,742 | 5/1995 | Asano . |

OTHER PUBLICATIONS

IEDM, 1988, M. Gill et al., "A 5–Volt Contactless Array 256Kbit Flash EEPROM Technology," IEEE, 1988, pp. 428–431.

IEDM, 1988, R. Kazerounian et al., "A 5 Volt High Density Poly–Poly Erase Flash EPROM Cell," IEEE, 1988, pp.436–439.

IEDM, 1987, H. Kume et al., "A Flash–Erase EEPROM Cell with an Asymmetric Source and Drain Structure," IEEE, 1987, pp. 560–563.

IEDM, 1986, A.T. Wu et al., "A Novel High–Speed 5–Volt Programming EPROM Structure with Source–Side Injection," IEEE, 1986, pp. 584–587.

IEDM, 1980, M. Wada et al., "Limiting Factors for Programming EPROM of Reduced Dimensions," IEEE, 1980, pp. 38–41.

Prall et al., "Characterization and Suppression of Drain Coupling in Submicrometer EPROM Cells", IEEE Transactions on Electron Devices, vol. ED–34, No. 12, pp. 2463–2468 (Dec. 1987).

European Search Report for corresponding application BE 9100091 bearing the date "Oct. 8, 1991."

J. Van Houdt, et al., "A 5v/3.3V–Campatible Flash $E^2PROM$ Cell with a 400ns/70µs Programming Time for Embedded Memory Applications," 1993 Nonvolatile Memory Technology Review, IEEE, 1993, pp. 54–57.

J. Van Houdt et al., "A 5 V–Compatible Flash EEPROM Cell with Microsecond Programming Time for Embedded Memory Applications," IEEE Transactions on Components, Packaging, and Manufacturing Technology—Part A, vol. 17, No. 3, pp.380–389 (Sep. 1994).

J. Van Houdt et al., "Optimization of a Submicron HIMOS Flash $E^2PROM$ Cell for Implementation in a Virtual Ground Array Configuration", $23^{rd}$ European Solid State Device Research Conference, Failure Physics and Analysis, Sep. 13–16, 1993, pp. 381–384.

D. Wellekens et al., "Write/Erase Degradation and Disturb Effects in Source–Side Injection Flash EEPROM Devices," $5^{th}$ European Symposium on Reliability of Electron Devices, Failure Physics and Analysis, Oct. 4–7, 1994.

J. Van Houdt et al., "HIMOS—A High Efficiency Flash $E^2EPROM$ Cell for Embedded Memory Applications," IEEE Transactions on Electron Devices, vol. 40, No. 12, pp. 2255–2263 (Dec. 1993).

UNIT CELL
CONTACTED S/D ARRAY

MEMORY ARRAY

CONTACTED CELL ARRAY CONFIGURATION FOR ERASABLE AND PROGRAMMABLE SEMICONDUCTOR MEMORIES

RELATED APPLICATIONS

This application is a continuation-in-part of U.S. patent application Ser. No. 08/426,685, filed Apr. 21, 1995 U.S. Pat. No. 6,009,013, and this application claims priority to U.S. Provisional Patent Application Serial No. 60/094,842, filed Jul. 31, 1998.

U.S. patent application Ser. No. 08/426,685 is a continuation-in-part of (i) U.S. patent application Ser. No. 08/275,016, filed Jul. 13, 1994 and now issued as U.S. Pat. No. 5,583,811, and (ii) U.S. patent application Ser. No. 08/080,225, filed Jun. 21, 1993 and now issued as U.S. Pat. No. 5,583,810.

U.S. patent application Ser. No. 08/275,016 is a continuation of U.S. patent application Ser. No. 08/080,225.

Application Ser. No. 08/080,225 is a continuation-in-part of U.S. patent application Ser. No. 07/827,715, filed Jan. 29, 1992 and now abandoned.

Applicants of the present application have been named as inventors in each of the above-identified applications. Applicants expressly incorporate herein by reference the entirety of each of the above-identified applications and patents.

BACKGROUND OF THE INVENTION

1. Field of the Invention

The present invention relates to the field of electrically erasable programmable read-only memory (EEPROM) devices and, more particularly, to array configurations for the implementation of memory cells that rely on source-side injection for fast programming.

2. Description of the Related Art

Recently, Flash EEPROM memories have gained substantial interest as the best solution for electrically-rewritable high-density nonvolatile data storage. These semiconductor memories combine the high integration density and the high programming speed of EPROMs with the to higher functionality of EEPROMs by offering electrical in-circuit erasability. Typically, Flash memories are distinguished from "classical" EEPROMs by their block (or sector) erase scheme. That is, in a Flash memory, the byte-selective erasability of EEPROMs is sacrificed for the sake of a higher integration density. The possibility exists, however, to divide the memory in different sectors, each of which can be erased separately.

At first, flash memory was introduced to replace program code EPROMs and battery-backed Random Access Memories ("RAMs") in measuring equipment (for calibration, trimming and data storage), in tuners and TV sets (for programmable channel selection), and in microcomputers (for microcode updates). On the other hand, new applications have arisen such as solid-state disks for small computers and Personal Digital Assistants ("PDAs"), program storage for Digital Signal Processing ("DSP") chips and for portable equipment, smart cards, automotive applications (such as fuel injection control and Automatic Breaking Systems ("ABS")) and neural networks. Additionally, a trend has arisen to integrate logic and nonvolatile memory on the same chip to provide embedded memories, which typically require a compromise between performance, density and processing complexity.

Many commercially available flash EEPROM devices (EEPROMs) use Channel Hot Electron Injection ("CHEI") for writing and Fowler-Nordheim (FN) tunneling through a thin oxide for erasure, although various alternative programming mechanisms have been proposed and implemented. Several classes of flash EEPROM are known.

One class of flash EEPROMs, referred to as "stacked gate" devices, are based on ETOX technology. FIG. 1 illustrates one such device, by way of example. In a stacked gate cell, the floating gate overlies the whole channel area from above the source region to above the drain region, and a single external control gate is arranged on top of the floating gate. After floating gate formation, a high quality dielectric layer (usually oxide-nitrideoxide (ONO)) is deposited to serve as an interpoly dielectric. Alternatively, this interpoly layer could be defined together with the first (and eventually the second) polysilicon layer in a stacked etch process. Stacked gate flash EEPROMs use CHEI at the drain junction for fast programming and FN injection from the floating gate toward the source junction for erasure.

The main advantage of the stacked gate flash EEPROM cell is its small area, which makes it well-suited for high-density applications (so-called bulk memory). The main disadvantages of the stacked gate cell, however, are high processing complexity, high power consumption (in order to compensate for the intrinsically low programming efficiency), and a presence of major reliability problems (such as overerase, soft-write and short-channel effects, and drain disturb) that compromise its scalability especially for embedded applications. Additionally, a conventional NOR array configuration, which is the configuration commonly used for stacked-gate type memory, requires ½ contact per bit. This requirement limits the yield for a matrix of memory cells, particularly as the density of memories continues to increase.

Contactless array configurations have been proposed for stacked-gate EPROM and Flash memory cells such as that shown in FIG. 1. (See, e.g., J. Esquivel et al., IEDM technical digest p. 592, (1986)). Advantageously, using a contactless array configuration for stacked-gate cells can increase the memory density significantly. An example of one such contactless array configuration is the Alternate Metal Ground ("AMG") configuration, as described by B. Eitan et al., "Alternate Metal Virtual Ground (AMG)—a new scaling concept for very high density EPROM's," IEEE Electron Device Letters, Vol. 12, No. 8, 450 (August 1991).

The AMG configuration, which was first developed for EPROMs and later extended to Flash memory, is, however, only possible at the expense of a complicated bitline segmentation scheme and a lower programming and read-out speed. Further, a main problem with these contactless array concepts generally is the high channel current required for channel hot-electron programming, which limits performance due to parasitic bit-line resistance and source-line resistances.

Another class of flash EEPROMs uses bi-directional FN tunneling and is essentially derived from conventional FLO-TOX EEPROMs. An example of such a bi-directional FN tunneling device is shown in FIG. 3. The main advantage of this cell is the very low power consumption that it requires for FN programming. Therefore, the programming voltages can be generated on-chip, and operation of the device requires only a single supply voltage.

The main disadvantages of these bi-directional FN tunneling devices, however, are the very high voltages (20 V) that need to be switched on-chip, and the corresponding reliability problems (such as oxide defects and junction breakdown), the large transistor area, and the low programming speed. While a smaller transistor area can be achieved, doing so will typically increase the processing complexity and reduce the gate coupling coefficient at the expense of even higher programming voltages. Additionally, while programming speed can be increased by using page-mode programming techniques, such techniques complicate circuit design. Further, the scalability of this cell concept is highly questionable, particularly because of limitations that exist with respect to tunnel oxide scaling.

A typical high-density configuration for these bidirectional FN tunneling memories is the NAND configuration, as shown, for instance, in FIG. 4. Unfortunately, however, this NAND configuration suffers from a very high access time on the order of microseconds. In addition, contactless array configurations have also been proposed for these devices, in an effort to maximize the array density in stand-alone memory devices. (See, e.g., M. Gill et al., "A 5 Volt Contactless Array 256K Bit Flash EEPROM Technology," Texas Instruments Inc., IEDM Technical Digest, 428 (1988)).

Still another class of flash EEPROMs take the form of asymmetrical flash memory transistors that use Source Side Injection (SSI) as a programming mechanism. An example of one such cell configuration, for instance, is disclosed by U.S. Pat. No. 5,212,541 (Bergemont), issued May 18, 1993 to National Semiconductor Corporation. The cell disclosed by Bergemont has a split-gate structure and includes (i) a first insulating silicon dioxide layer formed over the channel region between the source and drain, (ii) a polysilicon floating gate formed over the first insulating layer and extending from the drain to cover a first portion of the channel, (iii) a second silicon dioxide insulating layer formed over the floating gate, and (iv) a polysilicon control gate formed over the second insulating layer above the floating gate and having an access portion that extends above the remaining second portion of the channel over the first insulating layer. (See, e.g., Bergemont, at column 3, lines 26–55).

Once a transistor concept has been defined in a given process technology, it has to be designed in such a way that a practical memory organization is obtained. Moreover, the transistor properties have to be exploited in order to optimize the density of the resulting memory array or matrix, taking into account circuit-related parameters such as disturb conditions, delay times, read-out current and capacitive and resistive loads for the periphery circuits. Therefore, the basic layout of the transistor depends strongly on how different transistors are to be interconnected in a circuit. This is where the term "memory cell" comes in: a memory cell, as opposed to a memory transistor, is the practical layout of the transistor that is repeatedly copied through mirroring or translation along its symmetry axes in order to produce the full memory array or matrix.

The advantages of optimizing memory cells for contactless arrays in EPROM and EEPROM memories have long been recognized. For instance, Esquivel et al., "High Density Contactless, Self Aligned EPROM Cell Array Technology," IEDM 1986, describe this principle in a conventional EPROM array, while Gill et al., "A 5 Volt Contactless Array 256K Bit Flash EEPROM Technology", IEDM 1988, describe a similar contactless array for Flash memories.

It is also well known to those of ordinary skill in the art that asymmetrical Flash memory transistors, which often use source-side injection as a programming mechanism, are well-suited for the implementation in contactless arrays. Examples of such contactless arrays are disclosed, for instance, in the Bergemont patent described above, as well as in U.S Pat. No. 5,280,446, issued on Jan. 18, 1994 (Ma et al.) and U.S Pat. No. 5,284,784, issued Feb. 8, 1994 (Manley). In general, these contactless array configurations provide a separate control line for every column or row, which adds to surface area. While this area overhead can be largely relaxed by the use of an additional polysilicon layer, doing so would require the use of expensive and complicated triple polysilicon technology.

In addition, contactless arrays have other drawbacks as well. First, if the array is to have a common source architecture with dedicated bitlines, as shown in FIG. 6 for example, then the buried bitlines will limit the scalability of the cell, due to the necessary spacing rule between adjacent bitlines that cannot be scaled in proportion to the other cell dimensions. Second, even though source side hot-electron injection requires only moderate channel currents (compared to conventional drain side injection), voltage drops along the buried difflusion lines (especially the source line) can still deteriorate the read-out current and the access time, particularly in larger memories.

Furthermore, distributed contacts from active diffusion lines to metal have to be provided regularly (such as every 16 bits) in order to reduce the bit-line resistance and source line resistance. This adds to the overall size of the memory array, increasing the equivalent area per bit in addition to the contactless cell itself. In addition, this introduces asymmetry in the array, as the read-out current becomes a function of the distance between the considered cell and the closest contact. These uniformities have to be taken into account when designing the read-out circuitry, since the slowest bit will determine the access time of the memory.

In view of the deficiencies in the art, there is a need for an improved array of erasable and programmable semiconductor memories cells.

SUMMARY OF THE INVENTION

The present invention provides an optimum array configuration of High Injection Metal-Oxide-Semiconductor ("HIMOS™") transistors. These HIMOS™ transistors were described in priority U.S. patent applications Ser. Nos. 08/275,016 (now issued as U.S. Pat. No. 5,583,811) and 08/080,225 (now issued as U.S. Pat. No. 5,583,810), and the concept of using the HIMOS™ cell in a memory matrix was described in priority application Ser. No. 07/827,715 (at page 5, lines 17–18), filed Jan. 29, 1992.

The HIMOS™ transistor structure combines a low development entry cost with the remarkable features of the enhanced (source-side) injection mechanism. As a result, the HIMOS™ transistor yields a low-cost, single-supply voltage, fast-programmable flash memory technology, which requires only moderate voltages on-chip, and which shows a high immunity with respect to soft-write, overerase, short-channel and drain disturb effects.

With reference to FIG. 5, as already described in the priority applications, the HIMOS™ memory transistor according to the invention has a semiconductor substrate with a source region, a channel region and a drain region formed therein. The HIMOS™ cell has three separate gates. These gates are the control gate (CG), the floating gate (FG), and the program gate (PG).

In an embodiment of the invention, the floating gate FG is made in a first polysilicon layer. As described in the priority applications, the floating gate extends over a portion of the channel region and is insulated therefrom by a thin tunnel dielectric (oxide) layer. The floating gate controls a first portion of the channel. The floating gate serves to collect electrons during the programming operation. In accordance with the invention the floating gate FG has an extension insulated from the semiconductor substrate by a dielectric layer.

The control gate CG and program gate PG are formed in a second polysilicon layer. The control gate overlies the floating gate and further extends to overlie a second portion of the channel uncovered by the floating gate. As described in the priority applications, the control gate is insulated from the floating gate and from the second portion of the channel by an interpoly oxide layer.

The program gate PG of the HIMOS™ cell is formed outside the active zone of the semiconductor substrate. The program gate PG overlies the extension of the floating gate FG and is insulated therefrom by the interpoly oxide layer so as to form an electric capacitor with the extension. The object of the program gate is to couple a voltage to the floating gate, thereby programming the device through an enhanced electron injection mechanism.

This HIMOS™ cell is thus an advantageous structure compared to previous cells. For instance, in the stacked-gate cells as described above, the floating gate overlies the whole channel area from above the source to above the drain. After floating gate formation in typical stacked-gate devices, a high quality dielectric layer (such as an ONO) is deposited for the interpoly dielectric. Alternatively this layer could be defined with the first and eventually the second polyoxide in a stacked etch process. In contrast to these stacked-gate cells, the floating gate of the HIMOS™ cell covers only part of the channel area. As a result, the dielectric layer that is eventually deposited, after formation of the floating gate, extends over the uncovered portion of the channel and is covered later in the fabrication process by the control gate.

Further, the HIMOS™ cell structure is distinguishable from the split-gate structure of the Bergemont cell. As described in the above background section, for instance, the Bergemont cell includes a first oxide layer between the channel and the floating gate, and a second oxide layer between the floating gate and the control gate. As is common in stacked-gate devices, this second oxide layer may be an ONO layer. In turn, as is also common in stacked-gate devices, this second oxide layer of Bergemont is present only on top of the floating gate and not under the control gate on the uncovered portion of the channel region.

As those skilled in the art would appreciate, this Bergemont configuration would be fabricated in practice by executing an etch step after depositing the first polysilicon layer for the floating gate and the second oxide (ONO) layer thereon. In order to avoid harming the channel region, from where source-side injection is to be triggered, however, this etch would then stop at the first oxide layer, taking advantage of the difference in etch rates of the polysilicon and oxide layers. In this way, the first oxide layer would remain over the channel region under the control gate that is deposited thereafter, unlike in the HIMOS™ cell.

This fabrication process, however, would be both complex and costly. In addition, difficulty would likely arise in forming the equivalent of a dielectric layer between the adjacent vertical sidewalls of the floating gate and the control gate access portion. As a result, the interpoly leakage of the device could be limited by the (polyoxide) sidewall of the floating gate rather than by the high quality and expensive ONO layer on top of the floating gate.

In forming the HIMOS™ cell, in contrast, the interpoly oxide growth is advantageously combined with the oxide under the control gate. By combining these steps, the processing cost is considerably reduced. At the same time, however, the resulting HIMOS™ cell is very reliable, since it requires less excess charges on the floating gate to function as compared to stacked gate cells.

In all, the triple-gate structure and the specific operating modes of the HIMOS™ cell allow its implementation in a contactless array of moderate density (as described in co-pending U.S. patent application Ser. No. 08/426,685), which partially compensates for larger transistor area. Additionally, this renders the HIMOS™ transistor an attractive candidate for medium-density cost-effective Flash EEPROM applications.

While some of the priority applications have dealt particularly with the HIMOS™ transistor structure and operation, the present invention is directed to an optimum array configuration for implementing HIMOS™ transistors in memory circuits. Due to the triple-gate structure of the HIMOS™ transistor, the conventional NOR configuration as shown in FIG. 2 cannot be used efficiently.

In addition, as noted in the priority applications, the HIMOS™ transistor allows fast 5V-only and 3.3V-only programming by the use of a source-side hot-electron injection mechanism. This mechanism, however, requires a program gate in the field oxide region, in order to capacitively couple a high voltage to the floating gate and to thereby establish a very high injection current during programming. In turn, this additional program gate increases the cell area considerably. Consequently, the HIMOS™ cell has only been applied practically in embedded memory applications, where cell area is not the prime issue.

The present invention now introduces a new, contacted array configuration of HIMOS™ cells, which can be made much more dense than previous array configurations. In one aspect, an array according to the present invention can be a contacted 5V-only Flash EEPROM matrix that relies on shared program lines in order to minimize the area overhead that is caused by the added program gate. According to the invention, for example, the source contacts and drain contacts of the HIMOS™ cells can be shared between adjacent rows and columns, and the program gates can be shared between adjacent rows. Consequently, the effective cell area can be significantly reduced to thereby render the HIMOS™ cell suitable for both medium-density and embedded applications. In addition, if bitlines are also shared between adjacent columns, a virtual ground array can be obtained with even higher density (albeit at the expense of a somewhat more complicated column decoder).

As described in parent application Ser. No. 08/426,685, various contactless array configurations also exist for the HIMOS™ cell. A contacted array according to the present invention can be made much more dense than these contactless arrays.

The foregoing as well as other advantages of the present invention will become apparent to those of ordinary skill in the art by reading the following detailed description, with appropriate reference to the accompanying drawings.

BRIEF DESCRIPTION OF THE DRAWINGS

A preferred embodiment of the present invention is described herein with reference to the drawings, in which.

DETAILED DESCRIPTION OF THE PREFERRED EMBODIMENTS

Several array embodiments are presented in this section, which use several cell layouts and the same basic cell operating modes. Depending on the particular array configuration, however, different features are obtained from the point of view of array operation. Therefore, to better explain the advantages of the present invention, three sections will be presented below. The first section will discuss some limitations of contactless memory arrays. The second section will discuss a basic contacted configuration according to the preferred embodiment. Finally, the third section will discuss an exemplary contacted array embodiment in greater detail.

Figure 6:
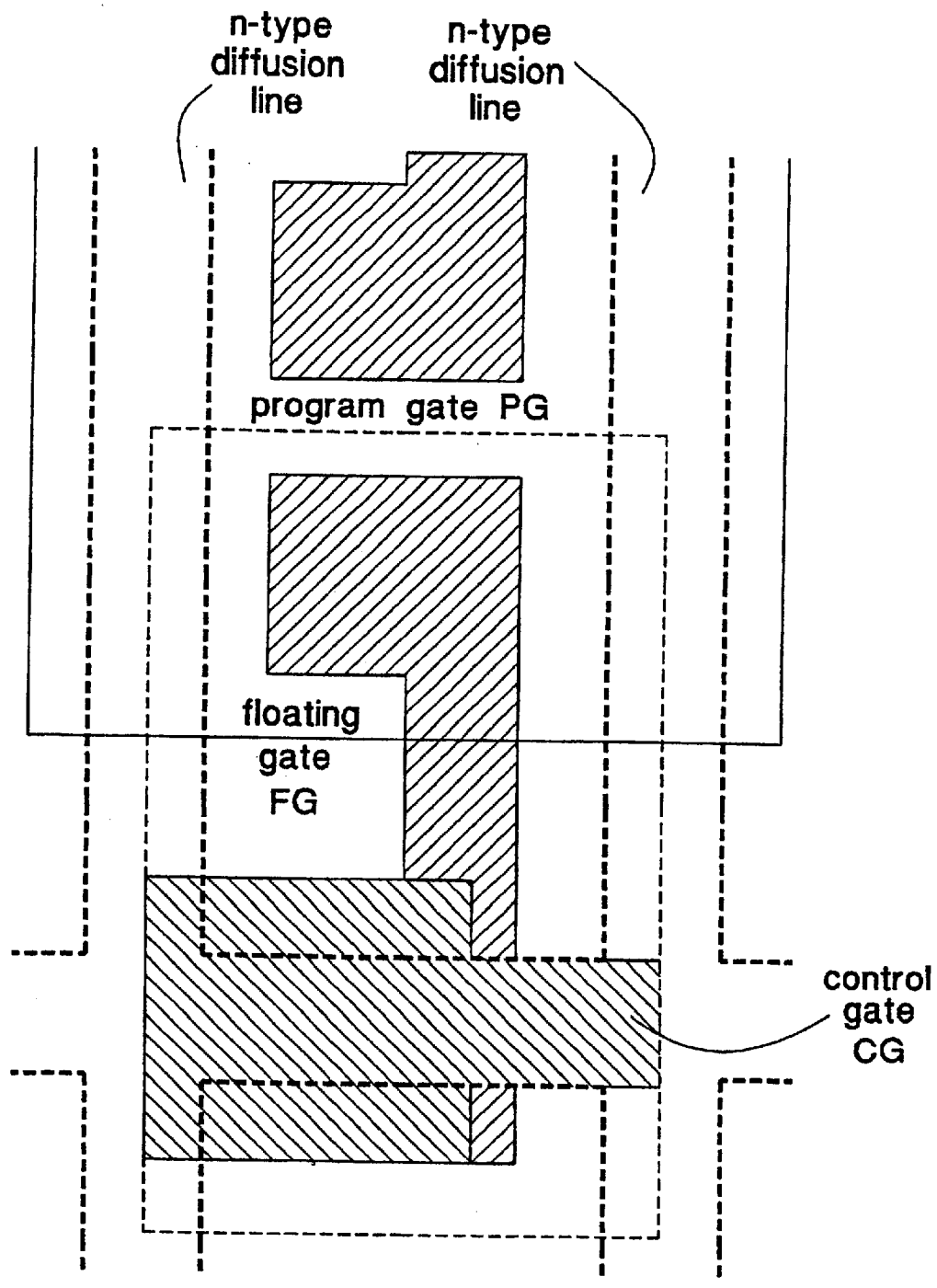
FIG. 6 illustrates an optimized HIMOS™ cell layout as used in a contactless Common Source Array (CSA) configuration with shared program gates.
Figure 7:
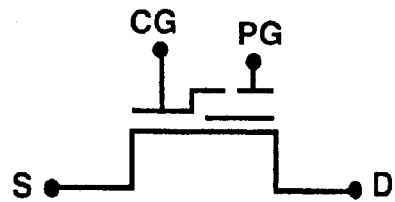
FIG. 7 illustrates a HIMOS™ symbol for an array description, including terminals for the a source junction (S), a drain junction (D), a control gate (CG) and a program gate (PG)

For convenient reference and clear depiction of the various array configurations in the drawings, the HIMOS™ cell layout that is copied in order to produce an entire array configuration is replaced by a small convenient symbol, which is represented in FIG. 7. This symbol is used throughout this description. It should be understood, however, that every HIMOS™ symbol in the following figures should be replaced by a cell layout such as those represented in FIGS. 5 or 6 in order to build the entire memory array.

1. Contactless Array Configuration

Figure 5:
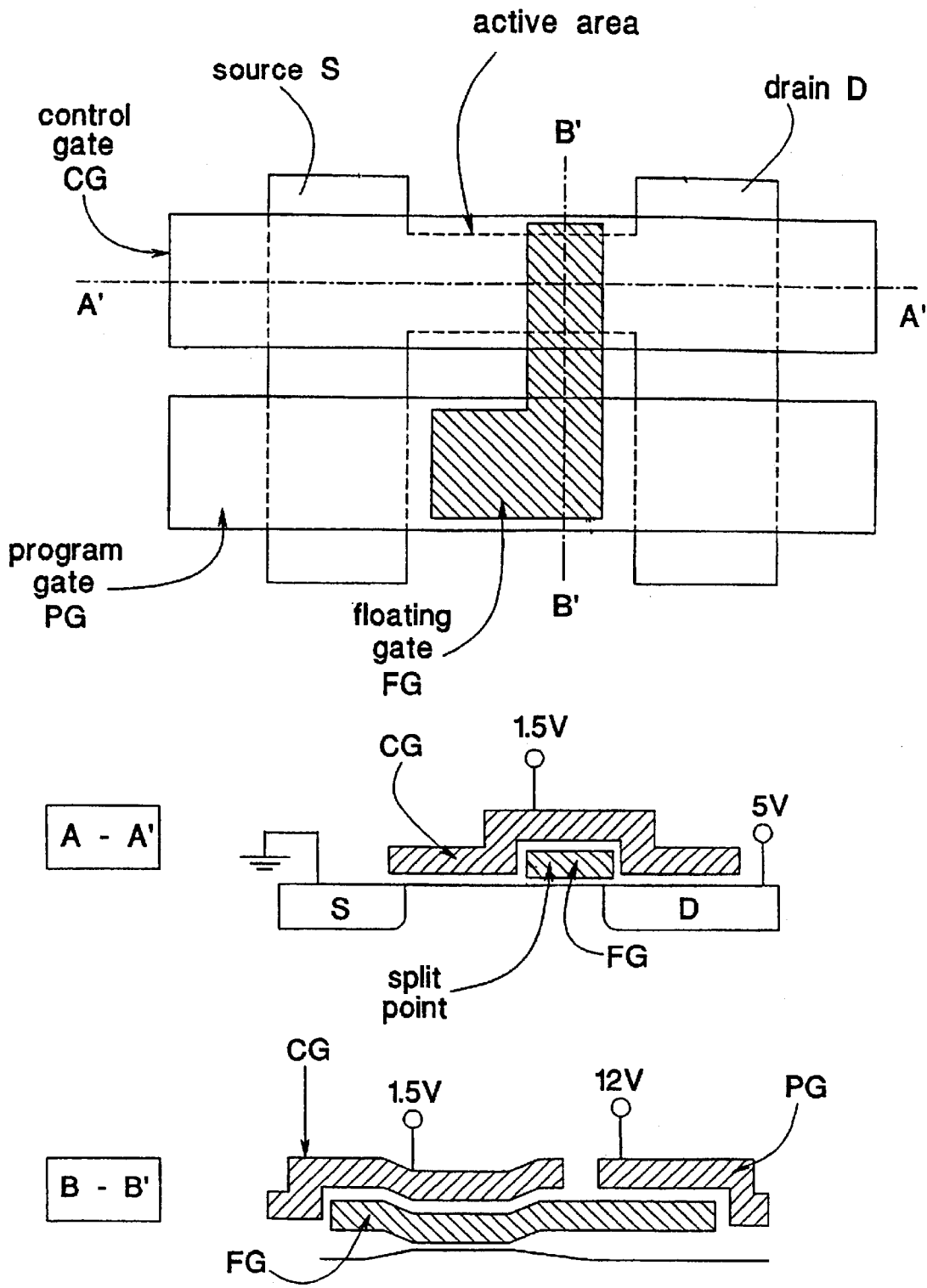
FIG. 5 illustrates a basic contactless layout of a HIMOS™ cell.

Referring to the drawings, FIGS. 5 and 6 show the cell layout of the HIMOS™ cell as used in a contactless array with shared program gates, as described in parent application Ser. No. 08/426,685. FIG. 5 illustrates a basic contactless layout of a HIMOS™ cell, including two perpendicular cross-sections and typical programming (writing) conditions for a 0.35 µm generation. As has been described, programming is established in this configuration by enhanced (or source-side) injection of hot electrons at the split point.

FIG. 6, in turn, illustrates an optimized HIMOS™ cell layout as used in a contactless common source array (or "CSA") configuration with shared program gates. In this configuration, each column of cells has a separate bitline. The floating gates are formed in the first polysilicon layer, while the control gate and the program gate are formed in the second polysilicon layer. Each program gate serves as a coupling capacitor for two different cells. Duplicating the layout of FIG. 6 in a horizontal direction creates a program line that connects all program gates of two adjacent rows of cells. Notice the large area loss, which is due to the presence of the buried n-type diffusion lines and the spacing therebetween. This loss becomes more and more disproportionate to the cell area with scaling down to the 0.35 µm generation and below.

The control gate forms the wordline of the array and is running horizontally over the active transistor area and over the source and drain junctions of the cells sharing the same row. The shape of the wordline has been designed in order to minimize the parasitic coupling coefficient between the control gate and the floating gate. On the other hand, the program gates of two adjacent wordlines are merged into one program line, which is also running horizontally across the array.

Figure 8:
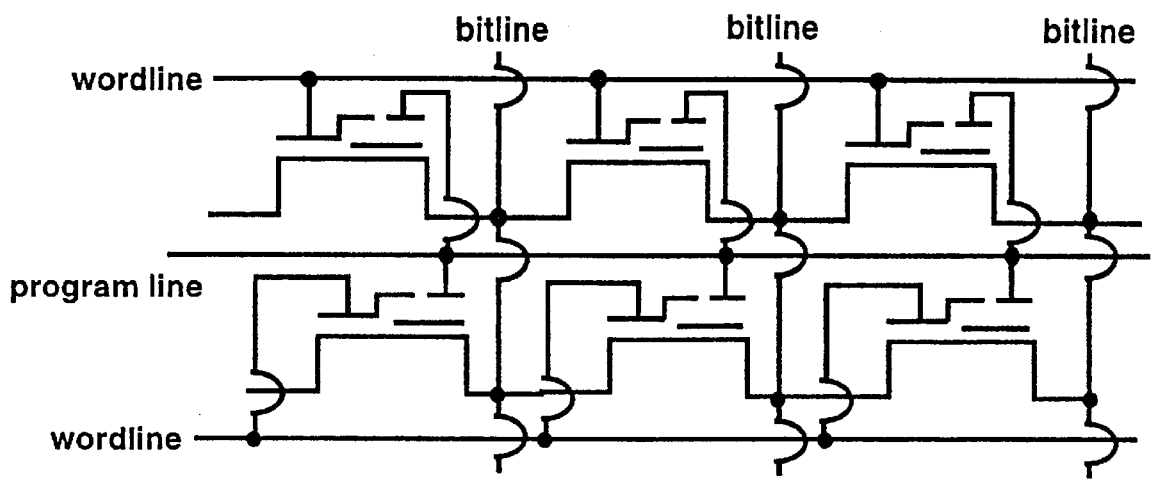
FIG. 8 illustrates a basic virtual ground array of the cell shown in FIG. 5, with shared program lines.
Figure 9:
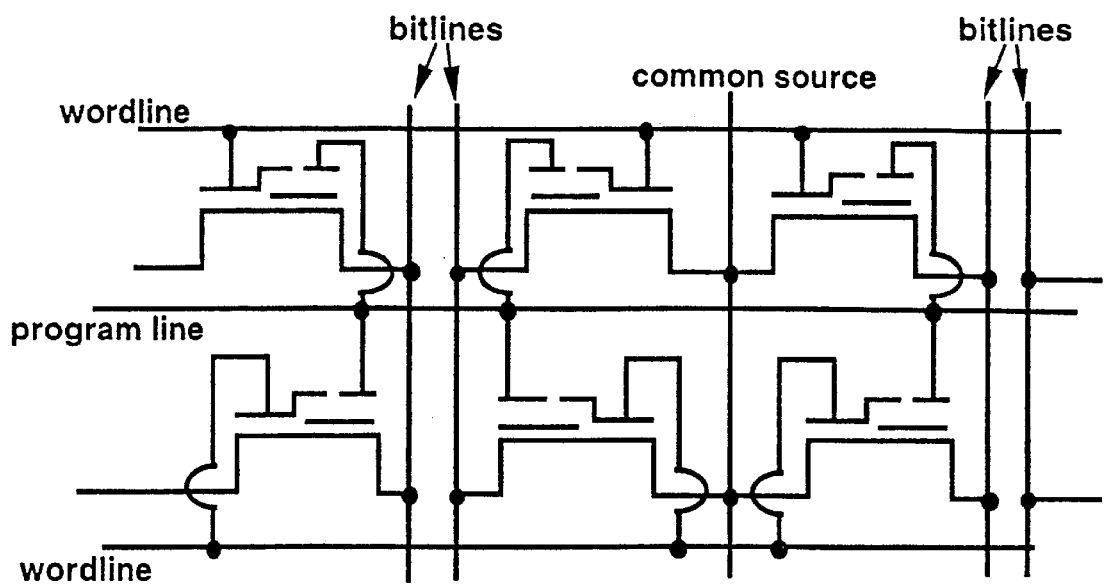
FIG. 9 illustrates a basic common source array of the cell shown in FIG. 6, with shared program lines.

FIGS. 8 and 9 next illustrate exemplary array configurations of the HIMOS™ cell layouts shown in FIGS. 5 and 6. FIG. 8 illustrates a basic virtual ground array with shared program lines, which is achieved by duplicating the cell layout of FIG. 5 according to the connections shown. FIG. 9, in turn, illustrates a basic common source array with shared program lines, which is achieved by duplicating the cell layout of FIG. 6 according to the connections as shown.

Since the source and drain junctions of the different cells in these arrays are connected to vertical diffusion lines that run under the polysilicon wordlines and program lines, these diffusion lines are connected to a metal strap, for instance, every 16 or 32 bits. This explains the term "contactless array." Depending on the particular array configuration, the right-hand side symmetry axis can be positioned in the middle of the bitline, as in the virtual ground array of FIG. 8, or in the middle of the spacing between the separate bitlines, as in the common source array of FIG. 9.

Duplicating the layouts of FIGS. 5 and 6 according to the interconnection schemes of FIGS. 8 and 9, respectively, will provide an entire contactless array, as explained in priority application Ser. No. 08/426,685. However, these array configurations have some limitations.

Figure 1:
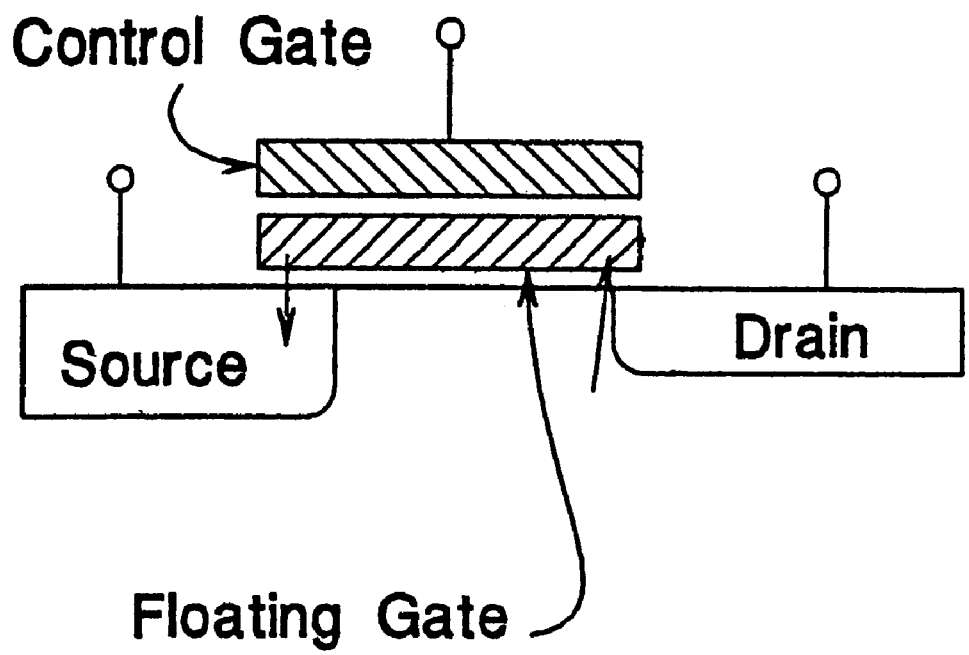
FIG. 1 illustrates a typical stacked-gate Flash EEPROM cell that which uses conventional channel hot-electron injection at the drain junction for programming and Fowler-Nordheim tunneling at the source junction for erasing.
Figure 3:
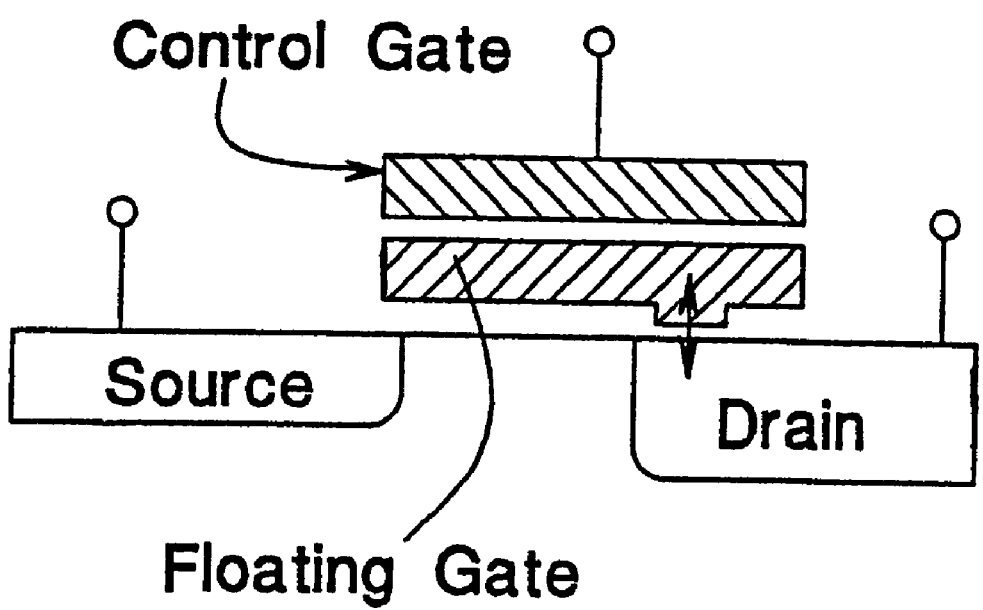
FIG. 3 illustrates a typical Flash EEPROM cell that uses bidirectional Fowler-Nordheim tunneling for both programming and erasure, wherein, in some cases, the tunnel region may cover the entire channel area.
Figure 4:
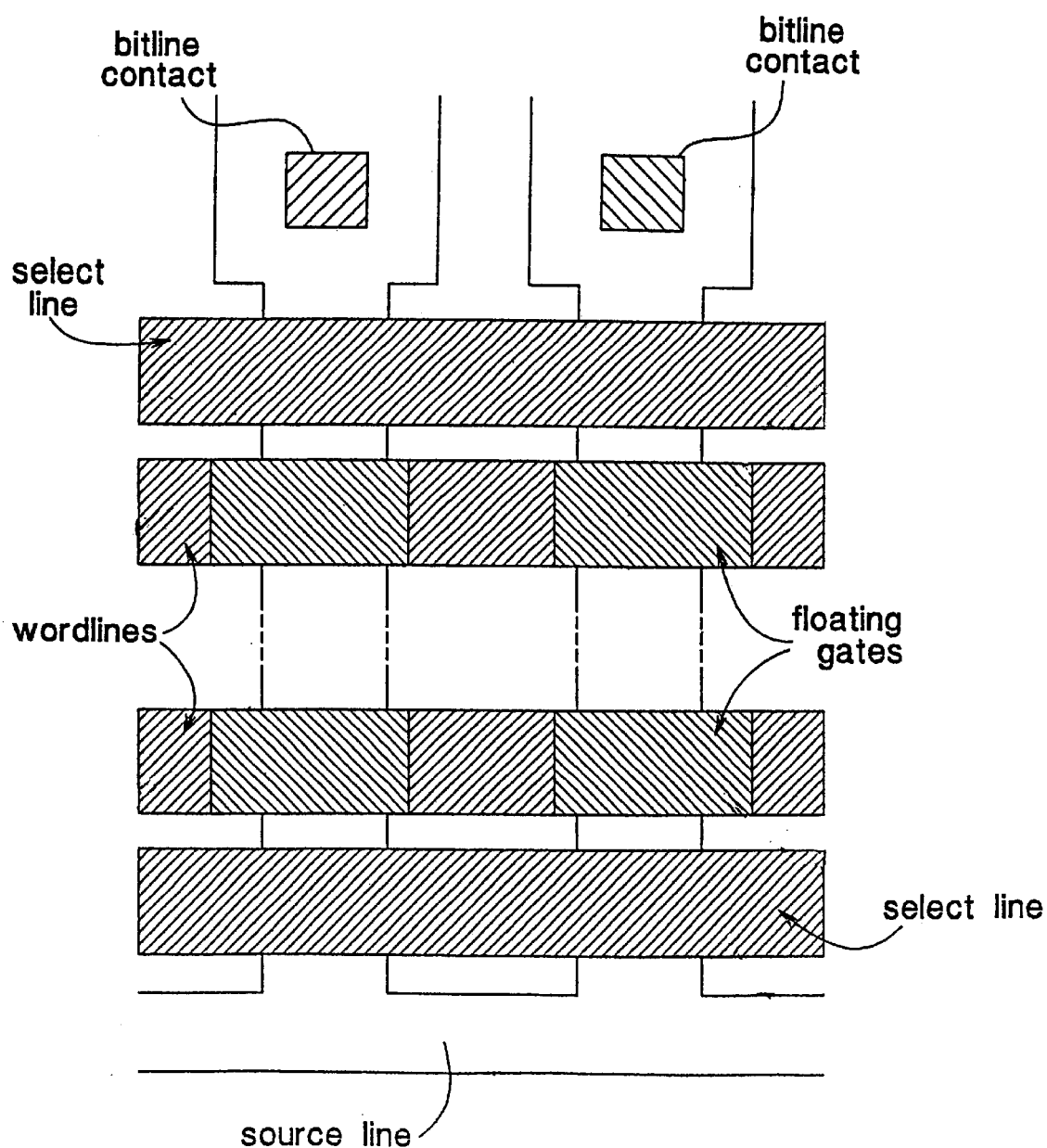
FIG. 4 illustrates a typical NAND configuration used only for the cell shown in FIG. 3, in which multiple cells (e.g., 16 cells) may be positioned in series with two select gates and only one contact per "cell string"

First, in contrast to other memory devices (such as those depicted in FIGS. 1 and 3), the HIMOS™ cell includes an additional capacitor outside the active area, namely, the coupling capacitor between the program gate and the floating gate. As a result, a contactless version of the cell is not by default smaller than a contacted version. For instance, the coupling capacitor area (which is $L_p \times W_p$) consumes more area in a contactless version when scaling down. This is a consequence of the fact that length $L_p$ is limited by the floating-gate poly to active spacing. Thus, width $W_p$ has to be increased in order to maintain sufficient coupling from the program gate to the floating gate. When scaling the cell down to deep-submicron technologies, the impact of this coupling area on the overall cell area tends to become larger, and thereby compromises the scalability of cell area with respect to the square of the feature size ($F^2$).

Further, if every column needs to have its own bitline, according to FIGS. 6 and 9 (the so-called common source array), then the overhead becomes even worse. In particular, the floating gate is then squeezed in between source and bitline at a considerable distance from both lines, and the field region between the bitlines is lost for any other purpose. The spacing between these adjacent bitlines, on the other hand, can not be scaled down with respect to the feature size of the technology, since the program line that bears the high programming voltage has to run above this field region, enforcing a large active area spacing rule in order to maintain the high field threshold value.

For instance, the bitline spacing using 1.25 µm CMOS technology is 1.8 µm, while the bitline spacing with 0.7 µm technology only decreases to 1.4 µm. This "dead area" therefore increases in relation to the cell area when scaling down toward the next generation. In summary, the buried bitlines in these contactless array configurations may limit the scalability of the HIMOS™ case, because of the presence of the additional coupling capacitor. This is especially so in a common source configuration, where the cell may becomes too large for practical implementation in deep-submicron technologies.

Another limitation of contactless array configurations is that the read-out current for arrays larger than 64 kbit becomes a function of the position of the cell with respect to the distributed source contacts and bitline contacts. This relationship is a consequence of the significant parasitic diffusion line resistance. For instance, a 0.7 µm version of such a cell provides about 120 µA of current for a 3 V control-gate voltage. In a 64 kbit product, however, this is reduced to only 70 µA for an average cell. Salicidation will not solve the problem when scaling down, because the wordline and the program line run over the buried diffusion lines as shown in FIGS. 5 and 6, so these lines are only partially salicided. This lower read-out current compromises access times and endurance, because the Flash read-out mode is essentially based on current sensing.

Still another limitation of contactless array configurations is that the buried diffusion lines result in identical source and drain junctions (both implanted before 2nd poly deposition). This junction is optimized for large underdiffusion (approximately 0.35 µm in a 0.71 µm version) at the drain side of the cell in order to allow erasure by Fowler-Nordheim tunneling. Since this implant is also used for the source junction formation and for the buried lines, a number of layout rules arise that compromise scalability. One requirement, for example, is that the part of the channel that is controlled by the control gate will have to be drawn at about 1 µm in order to obtain a final channel length (after processing) of about 0.7 µm. Furthermore, the underdiffusion of this implant is also present under the field oxide in the case of the diffusion lines, which further inhibits the scaling of spacing rules for the common source array.

2. Contacted Array Configuration

The present invention circumvents the foregoing and other limitations by introducing a contacted cell configuration with shared program lines, which exploits the features of the HIMOS™ cell. This contacted array configuration further decreases the cell area, while increasing performance due to a corresponding decrease in the parasitic source and drain line (or bitline) resistance.

In cases where the cell area is not limited by metal interconnect rules, it turns out that an innovative layout using shared contacts and a shared program gate facilitates a considerable reduction in cell area. As a result, the configuration enables higher array-level read-out currents and, hence, shorter access times in larger memories. In addition, since Flash sensing is essentially a current sense operation, and since read-out currents tend to decrease with write/erase cycling, these configurations also offer additional margin on the endurance specifications at the circuit level.

Figure 10:
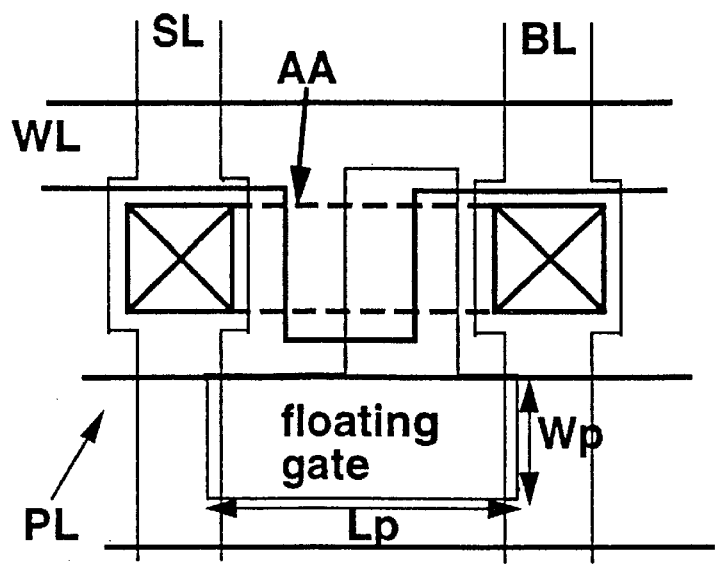
FIG. 10 illustrates a contacted layout for the HIMOS™ cell.

According to a preferred embodiment, the above-mentioned HIMOS™-specific problems can be greatly reduced and/or eliminated by implementing contacts inside the cell layout as illustrated in FIG. 10. In this configuration, the contacts are shared between adjacent columns and/or rows and the length $L_p$ of the program-gate-to-floating-gate coupling area is increased. As a result, the overhead from these contacts can be reduced. Further, by increasing the coupling area length $L_p$, it becomes possible to decrease the width $W_p$ of the coupling considerably. Thus, introducing the contacts into the cell offers more flexibility in cell design due to the presence of the additional coupling capacitor.

Referring to FIG. 10, the dimension $L_p$ according to this preferred embodiment is no longer limited by the poly to active spacing rule. In fact, $L_p$ can be maximized to the point where all floating gates are spaced apart by only the poly spacing rule itself. Particularly in the case of a common source array, the resulting gain is considerable, allowing a significant reduction in the other dimension ($W_p$) of the capacitor. For CMOS generations below 0.7 µm, this results in a net decrease in cell area. In other words, the reduction of the parameter $W_p$ in the contacted case overcompensates the loss associated with the contacts. In the case of a virtual ground array, the reduction of $W_p$ for a given coupling ratio is also smaller, although the cell size is comparable to that in the contactless array configuration.

These conclusions hold true for the HIMOS™ cell, again, because of the special features associated with the additional program gate on the field region. For instance, in the a virtual ground cell (FIG. 10, with ½ source contact and ½ drain contact per cell), the cell size is about 5 µm² in a 0.35 µm technology, and the contactless cell is also about 5 µm². On the other hand, a common source cell (½ source contact and 1 drain contact per cell) is about 7 µm², whereas a contactless cell with the same program-gate-to-floating-gate coupling ratio is about 8–9 µm². Furthermore, the bitline spacing in the latter case is only limited by metal pitch, which scales well with the technology generation in contrast to active area spacings with highly underdiffused implants.

With the preferred embodiment of the invention, array parasitics are also minimized, since the source and bitlines are in metal only, connected to every other cell on the same column. Advantageously, this not only decreases the resistance but also improves the uniformity of the read-out currents over the entire array, due to the full symmetry of the cell environment. Especially for larger densities (e.g., 1 Mbit and more), this contacted array configuration will perform better and more uniformly in the basic operating modes, due to a more efficient transportation of the operating voltages across the entire array.

For instance, since programming is achieved by channel hot electrons, the programming behavior will be more uniform across the array. In addition, the read-out current extracted from the array will be higher and more uniform (less position-dependent), which will improve the overall access time. Further, the erase operation will also benefit from this configuration, since the band-to-band tunneling current that flows from the drain junctions of the cells to the substrate will cause comparable voltage drops along the bitlines for each of the cells.

As yet another benefit of the preferred embodiment, since the wordline ("WL" in FIG. 10) is no longer routed over the source junction, it becomes possible to use a standard CMOS n⁺ junction at the source side of the cell. As a result, the part of the channel that is controlled by the control gate can be limited to the minimum feature size. Thus, for instance, where the bitline is shared between adjacent columns (the so-called virtual ground array), it is possible to achieve a very beneficial and straightforward array organization by alternating the direction of the cell along a wordline.

Figure 11:
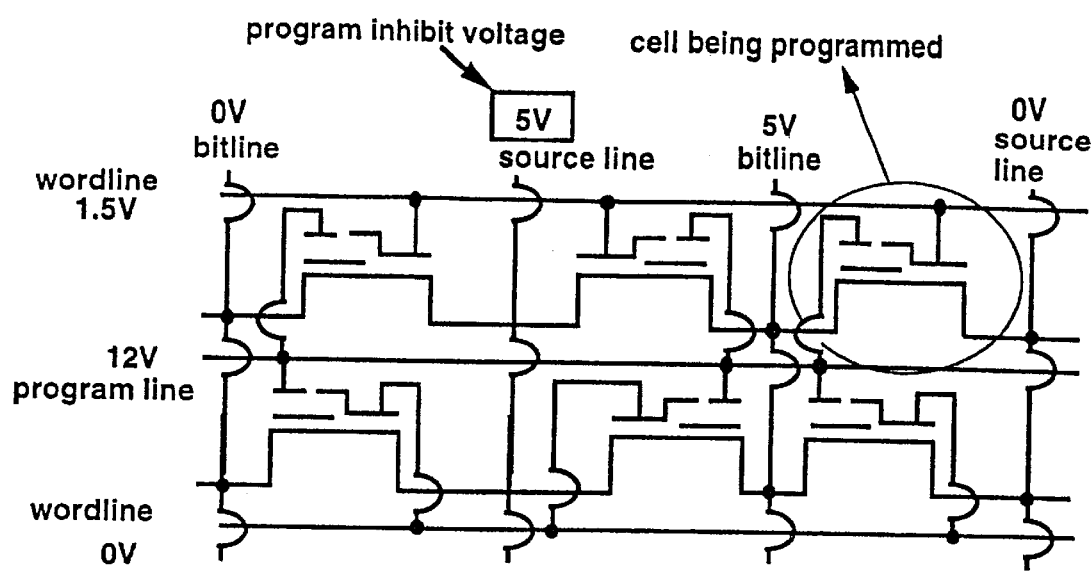
FIG. 11 illustrates an efficient array configuration for contacted HIMO™ cells with typical voltages to be applied during programming.

An example of this configuration is shown in FIG. 11. In this configuration, dedicated source lines and bitlines are shared between adjacent columns, and typical voltages are applied during programming. This type of configuration has been described in priority application Ser. No. 08/426,685 as "contactless NOR" layout, where the cells in the array do not contain any to contacts. This scheme can also be applied, however, to the contacted cell shown in FIG. 10, with advantageous results. For instance, sharing the source lines and bitlines between adjacent columns reduces the impact of the contacts on the array density. The source line of the cell that shares its drain junction with a cell being programmed needs to be biased at the supply voltage Vcc in order to inhibit unwanted programming. This excludes the possibility for using a common source configuration, as full source decoding is required.

Figure 2:
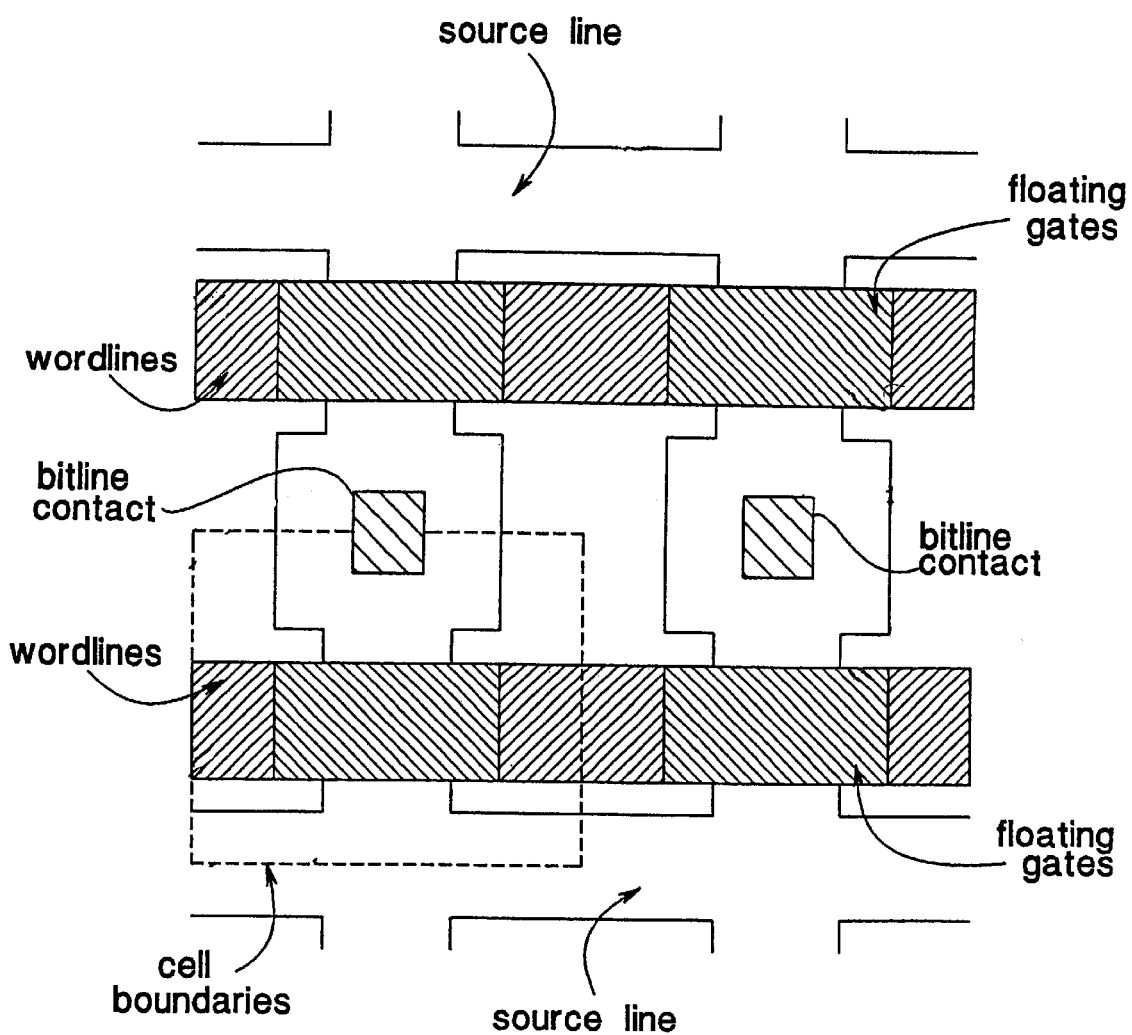
FIG. 2 illustrates a typical NOR configuration used for the cell shown in FIG. 1, in which each cell a contains ½ bitline contact while a common source line is shared by a large number of cells.

A main difference between this and the conventional virtual ground array as shown in FIG. 8 is that every vertical metal line is either a dedicated bitline or a dedicated source line. This configuration has some similarity with the conventional NOR array shown in FIG. 2, but the bitlines are now shared between cells in a row, whereas, in the conventional NOR scheme, bitlines are shared between cells in the same column.

Despite the similarity, however, a basic difference is that the source can no longer be common in an array; additional voltages are necessary in order to obtain selectivity during programming. Indeed, a cell that shares the bitline of a cell being programmed on the same row will also be programmed unless an "inhibit voltage" equal to the supply voltage is also applied to its source junction (FIG. 11). With this correction, the problem is resolved, since the next cell on the same row is biased in the reverse way, thereby suppressing the enhanced hot-electron injection mechanism. As a consequence of this configuration, adjacent cells in the same row can not be programmed or read-out at the same time. Therefore, the byte organization has to be adapted by employing a proper decoding scheme.

If the bitlines of the respective columns in the array are entirely isolated, a common source array is obtained (FIG. 9). The main advantage of this configuration is that the source lines can be physically grounded through a substrate (or well) contact. As a result, the source potential always stays very close to the ground potential, which ensures a high read-out speed, even in large memory arrays. Another advantage is the straightforward decoder design: the control gate forms the wordline, each column of cells connects to a separate bitline, and source decoding becomes redundant. The main disadvantage, however, is the larger cell area (typically 7 $\mu m^2$ in a 0.35 $\mu m$ CMOS technology) which is due to the bitline spacing.

3. Another Exemplary Embodiment of a Contacted Array Configuration

To illustrate the layout flexibility that is facilitated by implementing contacts in the HIMOS™ cell, an exemplary embodiment will now be described. As noted above, in order to reduce the cell-area related to the contacts in the contacted array configuration, contacts are shared between multiple cells. As discussed above, source and bitline contacts may be shared between four adjacent cells. It will be appreciated that, by sharing the bitline contact between four cells, it is possible to obtain even smaller cells. However, doing so would be at the expense of coupling area between floating gate and program gate.

Figure 12:
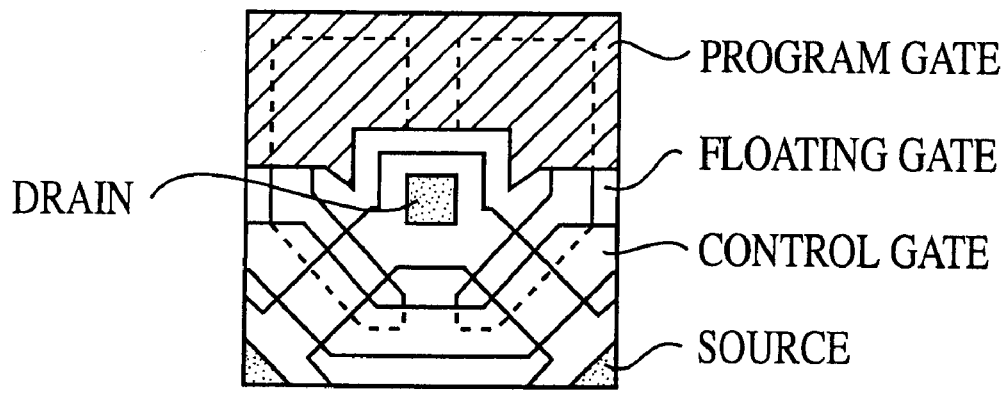
FIG. 12 illustrates an optimized "work-around-contact" layout compatible with the array configuration of FIG. 11.

Due to the large coupling capacitor located outside the active transistor area, a more area-thrifty matrix can be obtained by sharing the bitline between two cells only, as shown by way of example in FIG. 12. The area reduction provided by this configuration is especially significant in the case of nominal program gate ratios (i.e., large Wp).

Additionally, as shown in FIG. 12, the "dead area" discussed above can be minimized in this configuration by rotating both the source contact and the adjacent memory transistors (typically by 45°). This implies that the WL is bent around these source contacts, which also minimizes the parasitic coupling ratio between control gate and floating gates. The coupling ratio, in one embodiment, is at least 30%. The bitline contact is then placed in between two memory transistors and shared between both. As a result, all remaining cell area can be used to contribute to the program-gate-to-floating-gate coupling ratio, to establish fast programming. Again, with this configuration, this program gate is shared between different rows. The program gate line is routed in polysilicon and runs horizontally. Both source and bitlines are routed in metal, and run vertically; their mutual spacing is limited to metal pitch.

Advantageously, the cell area in this configuration is about 3 $\mu m^2$ in a 0.35 $\mu m$ CMOS technology. Further, from the foregoing, it is evident that this configuration would not be possible if the source lines and/or bitlines were buried diffusion lines.

Figure 13:
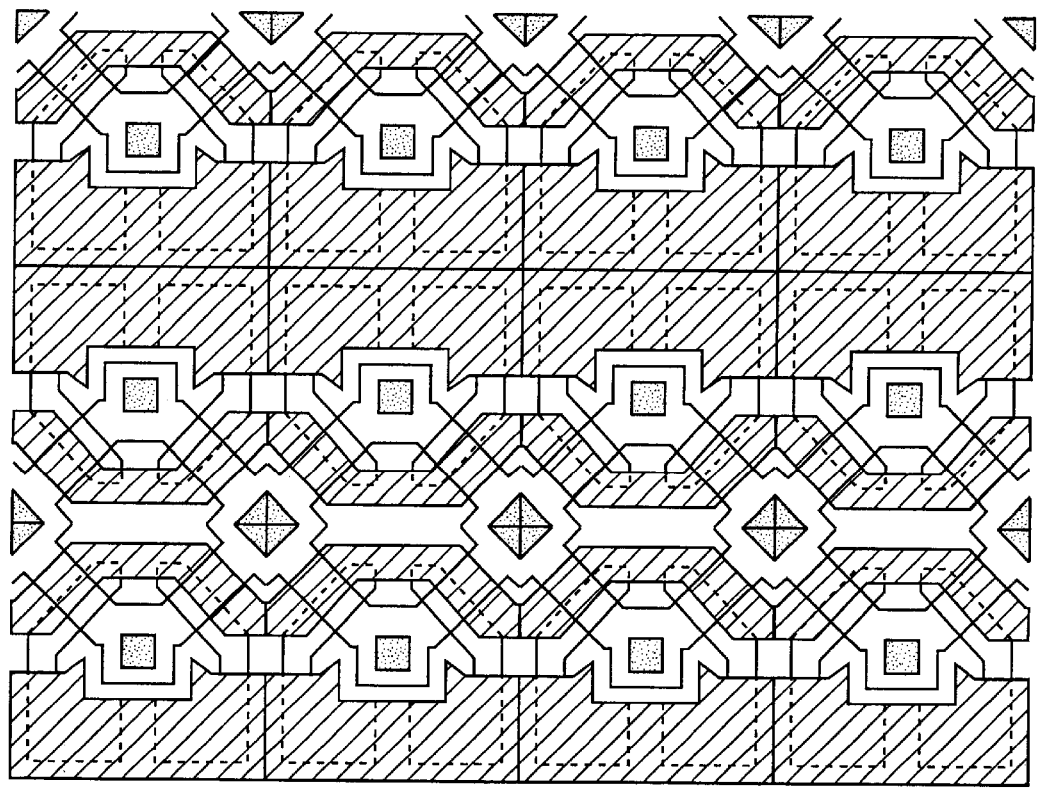
FIG. 13 illustrates an array layout for the cell layout in FIG. 12.

FIG. 13 illustrates, in turn, an array layout obtained by duplicating this cell according to FIG. 11. As shown in FIG. 13, the wordlines are "bent" around the source contact, which forces the memory transistor to be placed under 45° with respect to wordlines and bitlines. Due to the split-gate structure of the HIMOS™ cell and the presence of a program-gate, all 4 adjacent cells can be mirrored i.s.o. translated around a given source contact. Hence, it is possible to obtain an array configuration with dedicated source- and bitlines, which thereby simplifies the decoder logic. Further, by tuning the area of the program-gate-to-floating-gate coupling, different cell sizes are obtained, providing different performance levels, depending on the desired application for the array.

In addition, several other mechanisms can be used to further reduce the cell area. One possibility, for instance, is to use octagonal or circular contacts. When square contacts are used, the poly-to-contact spacing determines the spacing between a rotated poly-line and a corner of the bitline contact. For a given contact area this results in a large active area at the bitline side of the memory transistor. Advantageously, this effect can be reduced by modifying the shape of the contact hole, such as making it octagonal or circular.

Another way to reduce cell area is to share the WL between two adjacent rows. It is recognized, however, that this array configuration would require an inhibit voltage at the unselected program-gate line during read-out and, therefore, may compromise the access time.

Still another way to reduce cell area is to share the bitline contact between four adjacent cells, similar to sharing the source contact. This array configuration would allow an even smaller layout (e.g., 2.5 $\mu m^2$) for memory transistors with low program-gate-to-floating-gate coupling ratio are used. Therefore, this array is especially suited for applications where programming speed is not an issue.

Preferred embodiments of the present invention have been illustrated and described. It will be understood, however, that changes and modifications may be made to the invention without deviating from the spirit and scope of the invention, as defined by the following claims.

We claim:

1. A semiconductor memory matrix comprising a plurality of programmable EEPROM cells, each of said programmable EEPROM cells comprising:

a semiconductor substrate including a source region, a drain region and a channel extending between said source and drain regions, with a drain voltage between said source and drain regions;

a floating gate extending over a portion of the channel with a first dielectric layer therebetween;

a control gate extending over a portion of said floating gate through a second dielectric layer;

a common polysilicon wordline interconnecting said control gates of cells on a particular row;

a common polysilicon program line, the wordline being substantially parallel with the program line; and a program gate extending above said floating gate with a dielectric layer therebetween, said program gate forming a capacitor with said floating gate with a coupling ratio sufficient to couple a voltage at least as high as said drain voltage to said floating gate, thereby establishing a high voltage at a point in said channel between said control gate and said floating gate and ensuring a high hot-electron injection towards said floating gate.

2. The matrix as claimed in claim 1 wherein said control gate is extending from above said source region over another portion of the channel through said second dielectric layer.

3. The matrix as claimed in claim 1 wherein said dielectric layer in between said program gate and said floating gate is made of the second dielectric layer.

4. A semiconductor memory matrix as claimed in claim 1 wherein the floating gate of each of said EEPROM cells includes a first portion extending from below said control gate to below said program gate.

5. A semiconductor memory matrix as claimed in claim 4 wherein said coupling ratio is at least 30%.

6. A semiconductor memory matrix as claimed in claim 1, wherein the first dielectric layer comprises an oxide.

7. A semiconductor memory matrix as claimed in claim 1, wherein the second dielectric layer comprises an oxide and wherein the dielectric layer between said program gate and said floating gate comprises an oxide.

8. The matrix as claimed in claim 1 further comprising:

a plurality of adjacent wordlines arranged in pairs, where, for each pair, said program gates of the cells on the corresponding wordlines are connected to said common polysilicon program line.

9. The matrix as claimed in claim 1 further comprising:

a common polysilicon wordline interconnecting said control gates of cells on a particular row;

a common polysilicon program line; and a plurality of adjacent wordlines arranged in pairs, where, for each pair, said program gates of the cells on the corresponding wordlines are connected to said common polysilicon program line, any two adjacent rows of cells not connected to the same program line being connected to the same wordline.

10. The matrix as claimed in claim 1 wherein:

each cell defines an orientation, the floating gate extends in a first direction over the portion of the channel and ends over said channel, said floating gate integrally including first and second floating gate portions, said first floating gate portion extending near said channel with the first dielectric layer therebetween, and said second floating gate portion extending away from said channel, the program gate capacitively coupled through the dielectric layer to said second floating gate portion, and the control gate laterally remote in a second direction from said program gate and extending through the dielectric oxide layer over said first floating gate portion from above said source region, said first direction being substantially perpendicular to said second direction;

said cells defining columns as well as rows; and further comprising:

a plurality of common polysilicon wordlines, where each of said wordlines interconnects said control gates of said cells on a particular row, and where said wordlines define a direction;

said cells on a particular row having alternating orientations in said direction of said wordline;

each column of cells having a separate bit line electrically connected to the drain regions of the cells of said column; and each two adjacent columns of cells having the same source line connected to the source regions of the cells of said two columns.

11. The matrix as claimed in claim 1 further comprising:

a common polysilicon wordline interconnecting said control gates of said cells on a particular row;

a common polysilicon program line;

a plurality of adjacent wordlines arranged in pairs, where, for each pair, said program gates of the cells on the corresponding wordlines are connected to said common polysilicon program line;

a plurality of vertical bit lines;

said source and drain regions of said cells are connected to said vertical bit lines and said regions are strapped by said vertical bit line;

said program lines are isolated from said floating gates of said cells;

each cell defines an orientation, said cells define columns as well as rows, and said wordline defines a direction;

said orientation of said cells is identical in said direction of said wordline; and said vertical bit lines are common for any two adjacent columns of cells.

12. The matrix as claimed in claim 1 further comprising:

a common polysilicon wordline interconnecting said control gates of cells on a particular row;

a common polysilicon program line;

a plurality of adjacent wordlines arranged in pairs, where, for each pair, said program gates of the cells on the corresponding wordlines are connected to said common polysilicon program line;

a plurality of vertical bit lines;

wherein said source and drain regions of said cells are connected to said vertical bit lines and said regions are strapped by said vertical bit line;

said program lines are isolated from said floating gates of said cells;

each cell defines an orientation and said wordline defines a direction;

the cells on a particular row have alternating orientations in said direction of said wordline;

said cell orientation in said direction of said wordline is identical for cells connected to the same bit line; and voltage means for applying a supply voltage to said bit line, during programming, that is connected to said source region of the cell having its drain region connected to the same bit line as a cell being programmed.

13. The matrix as claimed in claim 1 further comprising:

a common source line contact shared between adjacent cells;

a common bit line contact shared between adjacent cells;

a common polysilicon program line;

a vertical source line interconnecting the common source line contacts of cells along adjacent columns; and a common vertical bit line interconnecting the common bit line contacts of cells along adjacent columns.

14. The matrix as claimed in claim 13 wherein said common polysilicon program line is a horizontal polysilicon program line.

* * * * *